US009437523B2

(12) United States Patent
Joshi et al.

(10) Patent No.: US 9,437,523 B2
(45) Date of Patent: Sep. 6, 2016

(54) TWO-SIDED JET IMPINGEMENT ASSEMBLIES AND POWER ELECTRONICS MODULES COMPRISING THE SAME

(71) Applicant: Toyota Motor Engineering & Manufacturing North America, Inc., Erlanger, KY (US)

(72) Inventors: Shailesh N. Joshi, Ann Arbor, MI (US); Ercan M. Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 167 days.

(21) Appl. No.: 14/291,686

(22) Filed: May 30, 2014

(65) Prior Publication Data
US 2015/0348869 A1    Dec. 3, 2015

(51) Int. Cl.
  *H01L 23/473*    (2006.01)
  *H01L 25/07*    (2006.01)
(52) U.S. Cl.
  CPC ........... *H01L 23/4735* (2013.01); *H01L 25/07* (2013.01); *H01L 2924/0002* (2013.01)
(58) Field of Classification Search
  CPC .... H01L 23/4735; H01L 23/36; F28F 13/02; F28F 3/12; H05K 7/2029; H05K 7/20845; H05K 7/20936; F25B 19/02; Y10S 165/90
  USPC ...................................... 361/700; 165/104.31
  See application file for complete search history.

(56) References Cited

U.S. PATENT DOCUMENTS 6,082,445 A * 7/2000 Dugan ................. F28D 9/0081
165/167
6,446,442 B1 * 9/2002 Batchelor ............... F25B 21/02
62/259.2
6,698,509 B2    3/2004 Rong
6,895,026 B2 * 5/2005 Miyajima ............ H01L 23/473
257/E23.098
6,988,535 B2 * 1/2006 Upadhya ................. F04B 17/00
165/104.21
7,277,283 B2   10/2007 Campbell et al.
(Continued)

OTHER PUBLICATIONS

Wang, P. et al., "Two-Phase Liquid Cooling for Thermal Management of IGBT Power Electronic Module"; Journal of Electronic Packaging; Jun. 2013, vol. 135, pp. 021001-1-021001-11; Dept. of Mechanical Engineering, University of Maryland.

(Continued)

*Primary Examiner* — Anthony Haughton
*Assistant Examiner* — Matt Dhillon
(74) *Attorney, Agent, or Firm* — Dinsmore & Shohl LLP (57) ABSTRACT

Power electronics modules having jet impingement assemblies utilized to cool heat generating devices are disclosed. In one embodiment, a jet impingement assembly includes coupled manifold plates having a fluid inlet and outlet, a distribution surface, and a collection surface. The distribution surface of the first and second manifold plate is coupled to define a distribution manifold having a fluid distribution channel and one or more arrays of orifices extending through both manifold plates. Heat transfer plates are coupled to each manifold plate's collection surface forming impingement chambers. The heat transfer plates include one or more arrays of fins extending toward the collection surface of each manifold plate fluidly coupled to the fluid outlet. The first and second manifold plates and the first and second heat transfer plates are positioned in a horizontal stack such that the fluid inlets of both manifold plates are adjacent.

20 Claims, 7 Drawing Sheets

(56) References Cited

U.S. PATENT DOCUMENTS

| | | | |
|---|---|---|---|
| 7,353,859 B2* | 4/2008 | Stevanovic | H01L 23/473 165/170 |
| 7,836,597 B2* | 11/2010 | Datta | F04B 17/00 165/104.33 |
| 8,199,505 B2 | 6/2012 | Dede | |
| 8,427,832 B2 | 4/2013 | Dede et al. | |
| 8,482,919 B2 | 7/2013 | Dede | |
| 8,659,896 B2 | 2/2014 | Dede et al. | |
| 2007/0215325 A1 | 9/2007 | Solovitz et al. | |
| 2010/0034528 A1* | 2/2010 | Willis | F24D 17/0068 392/451 |
| 2012/0103451 A1* | 5/2012 | Lin | E03C 1/084 137/833 |
| 2012/0212907 A1* | 8/2012 | Dede | H01L 23/4735 361/702 |
| 2012/0257354 A1* | 10/2012 | Dede | H01L 23/473 361/703 |
| 2013/0154142 A1* | 6/2013 | Ripple | B29C 47/062 264/40.1 |
| 2014/0024303 A1* | 1/2014 | Stausberg | B60H 1/241 454/152 |
| 2015/0021002 A1* | 1/2015 | Hoglund | F28F 3/046 165/133 |

OTHER PUBLICATIONS

S.N. Joshi et al, U.S. Appl. No. 13/902,003, Jet Impingement Coolers and Power Electronics Modules Comprising the Same, May 24, 2013.

* cited by examiner

TWO-SIDED JET IMPINGEMENT ASSEMBLIES AND POWER ELECTRONICS MODULES COMPRISING THE SAME

TECHNICAL FIELD

The present specification generally relates to jet impingement assemblies and, more particularly, two-sided, horizontally stacked jet impingement assemblies having internal flow control features.

BACKGROUND

Heat management devices may be coupled to a heat generation device, such as a power electronics device, to remove heat and lower the operating temperature of the heat generating device. A cooling fluid may be introduced to the heat management device, where it receives heat from the heat management device, primarily through convective and/or conductive heat transfer. The cooling fluid is then removed from the heat management device, thereby removing heat from the heat generating device. In one example, fluid may be directed in a jet in a localized region at a high velocity such that the fluid impinges a surface of the heat management device coupled to the heat generating device. Jet impingement may also be combined with two-phase cooling, where the heat generating device is cooled by the phase change of the coolant fluid from a liquid to a vapor. However, the vapor formed in this two-phased cooling process can be difficult to remove because the low density of vapor causes it to accumulate in the uppermost regions of the heat management device.

Further, as power electronic devices are designed to operate at increased power levels, the power electronics devices generate an increased corresponding heat flux. The increase in heat flux generated by the power electronics devices may render conventional heat sinks inadequate to reject sufficient heat to maintain a desired operating temperature in the power electronics device.

Accordingly, heat management devices that incorporate two phase, horizontally stacked jet impingement assemblies may be desired to mitigate high temperature operation of the power electronics devices.

SUMMARY

In one embodiment, a jet impingement assembly includes a first manifold plate coupled to a second manifold plate, each manifold plate having a fluid inlet, a fluid outlet, a distribution surface having a fluid distribution channel in fluid communication with the fluid inlet, and a collection surface having a fluid collection channel in fluid communication with the fluid outlet. The distribution surface of the first manifold plate is coupled to the distribution surface of the second manifold plate such that the fluid distribution channel of the first manifold plate and the fluid distribution channel of the second manifold plate define a distribution manifold. The jet impingement assembly further includes a variable slotted channel fluidly coupled to the fluid outlet at the distribution surface and an array of orifices extending from the distribution surface to the collection surface. A first heat transfer plate is coupled to the collection surface of the first manifold plate such that the first heat transfer plate and the collection surface of the first manifold plate form a first impingement chamber. The first heat transfer plate includes an array of fins that extends toward the collection surface of the first manifold plate and a second heat transfer plate is coupled to the collection surface of the second manifold plate such that the second heat transfer plate and the collection surface of the second manifold plate form a second impingement chamber. The second heat transfer plate includes an array of fins that extends toward the collection surface of the second manifold plate. The first manifold plate, the second manifold plate, the first heat transfer plate, and the second heat transfer plate are positioned in a horizontal stack such that the fluid inlet of the first manifold plate is adjacent to the fluid inlet of the second manifold plate.

In another embodiment, a power electronics module includes a jet impingement assembly having a first manifold plate coupled to a second manifold plate. Each manifold plate includes a fluid inlet, a fluid outlet, a distribution surface having a fluid distribution channel in fluid communication with the fluid inlet, and a collection surface having a fluid collection channel in fluid communication with the fluid outlet. The distribution surface of the first manifold plate is coupled to the distribution surface of the second manifold plate such that the fluid distribution channel of the first manifold plate and the fluid distribution channel of the second manifold plate define a distribution manifold. Each manifold plate further includes a variable slotted channel fluidly coupled to the fluid outlet at the distribution surface and an array of orifices extending from the distribution surface to the collection surface. A first heat transfer plate is coupled to the collection surface of the first manifold plate such that the first heat transfer plate and the collection surface of the first manifold plate form a first impingement chamber. The first heat transfer plate includes an array of fins that extends toward the collection surface of the first manifold plate and a second heat transfer plate is coupled to the collection surface of the second manifold plate such that the second heat transfer plate and the collection surface of the second manifold plate form a second impingement chamber. The second heat transfer plate includes an array of fins that extends toward the collection surface of the second manifold plate. The first manifold plate, the second manifold plate, the first heat transfer plate, and the second heat transfer plate are positioned in a horizontal stack such that the fluid inlet of the first manifold plate is adjacent to the fluid inlet of the second manifold plate. A first electronics device is positioned in contact with the first heat transfer plate opposite the array of fins and a second electronics device positioned in contact with the second heat transfer plate opposite the array of fins.

In yet another embodiment, a power electronics module includes a plurality of jet impingement assemblies. Each jet impingement assembly includes a first manifold plate coupled to a second manifold plate. Each manifold plate includes a fluid inlet, a fluid outlet, a distribution surface having a fluid distribution channel in fluid communication with the fluid inlet, and a collection surface having a fluid collection channel in fluid communication with the fluid outlet. The distribution surface of the first manifold plate is coupled to the distribution surface of the second manifold plate such that the fluid distribution channel of the first manifold plate and the fluid distribution channel of the second manifold plate define a distribution manifold. Each manifold plate further includes a variable slotted channel fluidly coupled to the fluid outlet at the distribution surface and an array of orifices extending from the distribution surface to the collection surface. A first heat transfer plate is coupled to the collection surface of the first manifold plate such that the first heat transfer plate and the collection surface of the first manifold plate form a first impingement chamber. The first heat transfer plate includes an array of fins that extends toward the collection surface of the first manifold plate. A second heat transfer plate is coupled to the collection surface of the second manifold plate such that the second heat transfer plate and the collection surface of the second manifold plate form a second impingement chamber. The second heat transfer plate includes an array of fins that extends toward the collection surface of the second manifold plate. The first manifold plate, the second manifold plate, the first heat transfer plate, and the second heat transfer plate are positioned in a horizontal stack such that the fluid inlet of the first manifold plate is adjacent to the fluid inlet of the second manifold plate. The plurality of jet impingement assemblies are interleaved such that each jet impingement assembly is adjacent to at least one other jet impingement assembly, the fluid inlets of adjacent jet impingement assemblies are aligned, and the fluid outlets of adjacent jet impingement assemblies are aligned. At least one electronics device is positioned between adjacent jet impingement assemblies.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to power electronics modules having jet impingement assemblies and apparatuses that may be utilized to cool heat generating devices, such as semiconductor devices. In the embodiments described herein, jet impingement is provided by directing jets of coolant fluid at an impingement surface of a thermally conductive heat transfer plate thermally coupled to a heat generating device. Heat is transferred to the coolant fluid as it impinges the impingement surface. In addition to jet impingement, two-phase cooling, wherein the coolant fluid changes phase from a fluid to a vapor, increases heat removal from the heat generating device. This may increase the operating life of the heat generating devices. The jet impingement assemblies are arranged in a horizontal stack, allowing efficient removal of vapor after impinging the impingement surface because the vapor will rise naturally to the fluid outlet of the jet impingement assemblies. The horizontal stack arrangement also positions heat transfer plates on two sides of the heat generating devices, thereby further removing heat flux from the heat generating devices and increasing the operating life of the heat generating devices.

Figure 1:
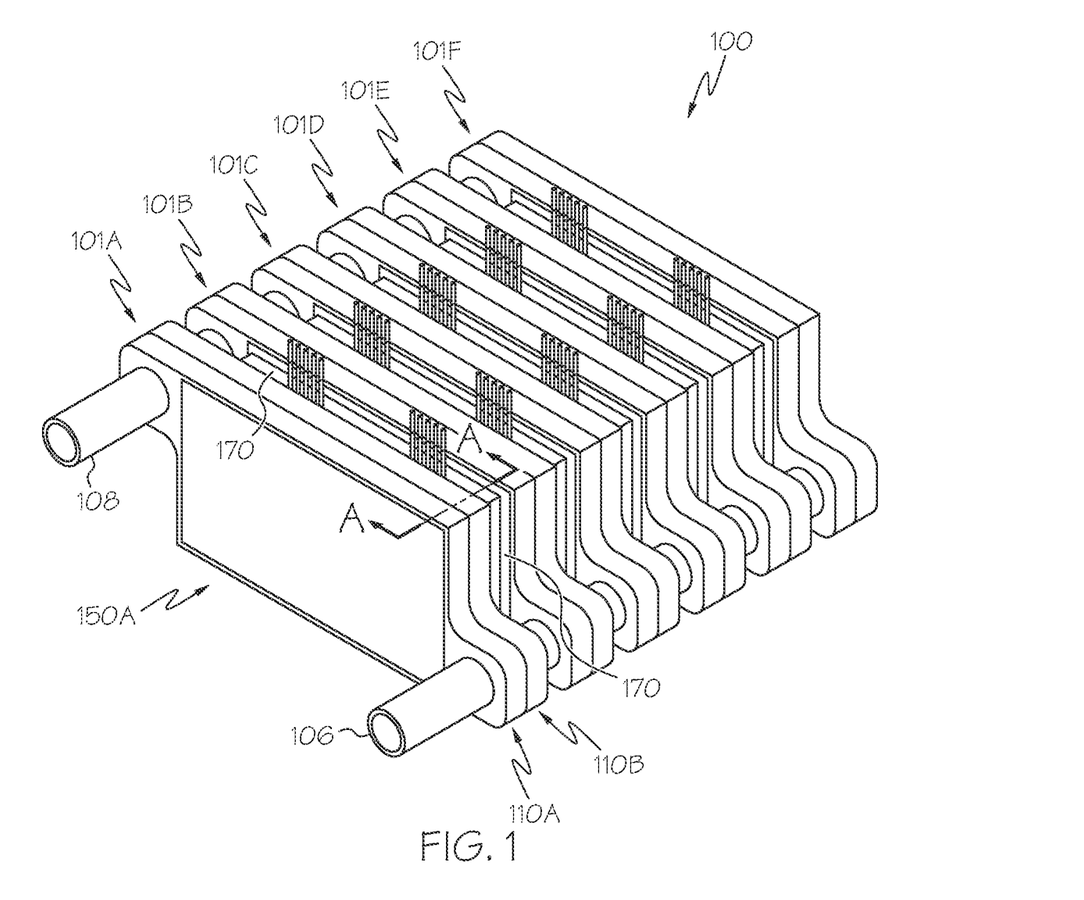
FIG. 1 schematically depicts an isometric view of an example power electronics module according to one or more embodiments shown or described herein.

Referring now to FIG. 1, an exemplary power electronics module 100 is depicted. The power electronics module 100 includes a plurality of jet impingement assemblies 101A-101F such that individual jet impingement assemblies 101A-101F are interleaved and each jet impingement assembly 101A-101F is adjacent to at least one other jet impingement assembly 101A-101F in a horizontal stack. In the embodiment depicted in FIG. 1, the power electronics module 100 includes a plurality of heat generating devices 170, such as electronics devices, positioned between the jet impingement assemblies 101A-101F. Although FIG. 1 depicts two heat generating devices 170 between adjacent jet impingement assemblies 101A-101F, it should be understood that any number of heat generating devices 170 may be positioned therebetween. The jet impingement assemblies 101 each comprise a first manifold plate 110A, a second manifold plate 110B, a first heat transfer plate 150A, and a second heat transfer plate 150B (not shown in FIG. 1), coupled to one another in a fluid-tight assembly and arranged in a horizontal stack. By arranging the jet impingement assemblies 101A-101F in a horizontal stack, the fluid inlet 112 (not shown in FIG. 1) is below the fluid outlet 114 (not shown in FIG. 1). This allows the vapor formed during jet impingement to rise naturally along an impingement surface 156 (not shown in FIG. 1) formed between a manifold plate 110 and a heat transfer plate 150, directing the vapor into the fluid outlet 114 and allowing efficient removal of the vapor.

The power electronics module 100 includes an inlet pipe 106 disposed between and in fluid communication with, the fluid inlet 112 of each manifold plate 110, and an outlet pipe 108 disposed between, and in fluid communication with, the fluid outlet 114 of each manifold plate 110. In some embodiments, the inlet pipe 106 and the outlet pipe 108 each comprise a single pipe extending through the fluid inlets 112 and fluid outlets 114 of the manifold plates 110, having a plurality of openings in fluid communication with each jet impingement assembly 101A-101F. In other embodiments, the inlet pipe 106 and the outlet pipe 108 each comprise a plurality of individual pipe segments positioned between the fluid inlets 112 of the jet impingement assemblies 101A-101F and between the fluid outlets 114 of the jet impingement assemblies 101A-101F. As described in more detail below, a coolant fluid enters the jet impingement assemblies 101A-101F by inlet pipe 106 and exits the jet impingement assemblies 101A-101F by outlet pipe 108. The coolant fluid may be any appropriate liquid, such as deionized water or radiator fluid. Other exemplary fluids include, for example and without limitation, water, organic solvents, and inorganic solvents. Examples of such solvents may include commercial refrigerants such as R-134a, R717, and R744. Selection of the composition of the coolant fluid used in association with the power electronics module 100 may be selected based on, among other properties, the boiling point, the density, and the viscosity of the fluid.

In some embodiments of the power electronics module 100, two heat generating devices 170 are coupled to each heat transfer plate 150. In other embodiments of the power electronics module 100, a single heat generating device 170 can be coupled to each heat transfer plate 150. Heat generating devices 170 may include, but are not limited to, electronics devices such as semiconductor devices, insulated gate bipolar transistors (IGBT), metal-oxide-semiconductor field effect transistors (MOSFET), power diodes, power bipolar transistors, and power thyristor devices. As an example and not a limitation, the heat generating device 170 may be a component in an inverter and/or converter circuit used to electrically power high load devices, such as electric motors in electrified vehicles (e.g., hybrid vehicles, plug in hybrid electric vehicles, plug in electric vehicles, and the like). As described in more detail below, the heat transfer plate 150 may further include surface features, such as thermally conductive fins, posts, and the like, to further enable heat transfer from the heat generating device 170 to the coolant fluid.

As described in greater detail below, the heat generating devices 170 may be coupled to a heat transfer surface 158 of the heat transfer plate 150, such as, for example, by thermal coupling. In one embodiment, the heat generating devices 170 are thermally coupled to the heat transfer surface 158 of the heat transfer plate 150 via an intermediate, thermally conductive substrate layer (not shown) (for example and without limitation, thermal paste, epoxy, direct bonded copper (DBC), direct bonded aluminum (DBA), or similar materials). The heat generating devices 170 may be bonded to the substrate layer by bonding techniques such as soldering, transient liquid phase bonding (TLP), or nano-silver sintering, for example. In some embodiments, the heat generating devices 170 are not bonded to the heat transfer surface 158 of a heat transfer plate 150 but rather just positioned adjacent thereto. As described above, heat transfer plates 150 are positioned on two sides of the heat generating devices 170. As described in more detail below, each heat transfer plate 150 is cooled using jet impingement, providing cooling on two sides of the heat generating devices 170.

Figure 2:
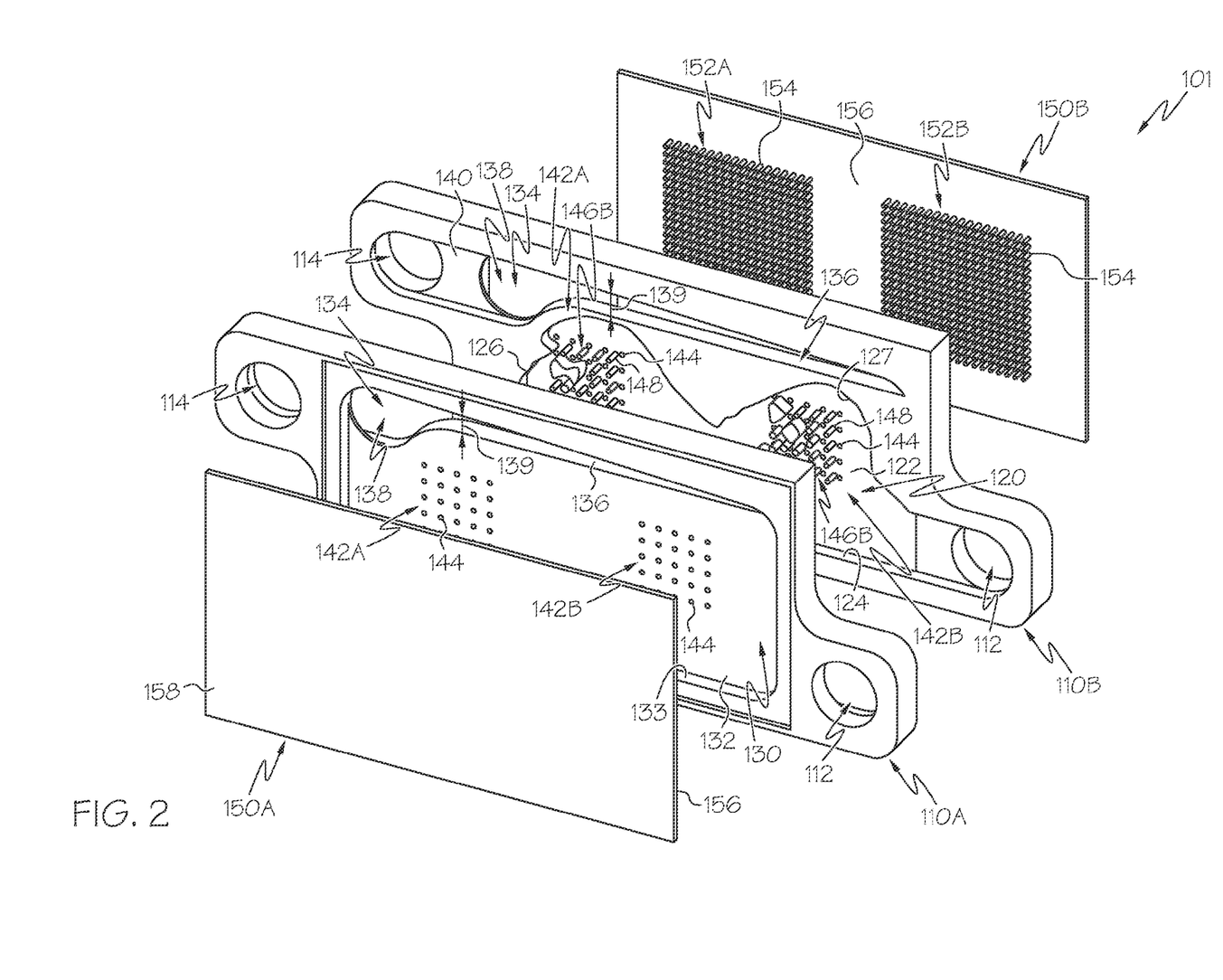
FIG. 2 schematically depicts an exploded isometric view of an individual jet impingement assembly shown in FIG. 1 according to one or more embodiments shown or described herein.

Referring now to FIG. 2, an example single jet impingement assembly 101 is depicted in an exploded isometric view. The jet impingement assembly 101 comprises first and second heat transfer plates 150A and 150B, which are substantially identical, and first and second manifold plates 110A and 110B, which are substantially identical. As described in more detail below, the first heat transfer plate 150A includes an impingement surface 156 coupled to a collection surface 130 of a first manifold plate 110A. The first manifold plate 110A includes a distribution surface 120 coupled to a distribution surface 120 of the second manifold plate 110B. The second manifold plate 110B further includes a collection surface 130 coupled to an impingement surface 156 of the second heat transfer plate 150B. Both the first and second manifold plates 110A and 110B comprise a fluid inlet 112 positioned diagonally from a fluid outlet 114. In some embodiments, each manifold plate 110 may be made from a generally thermally conductive material, for example and without limitation, copper, aluminum, steel, thermally enhanced composite materials, polymeric composite materials, graphite, molded plastic, or the like. Further, the heat transfer plates 150 may also be made from a thermally conductive material, for example and without limitation, copper, aluminum, steel, thermally enhanced composite materials, polymeric composite materials, graphite, or the like.

In the jet impingement assembly 101 depicted in FIG. 2, the first manifold plate 110A, the second manifold plate 110B, the first heat transfer plate 150A, and the second heat transfer plate 150B are positioned in a horizontal stack such that the fluid inlet 112 of the first manifold plate 110A is adjacent to the fluid inlet 112 of the second manifold plate 110B. In the various embodiments of the jet impingement assembly 101, the first manifold plate 110A is coupled to the second manifold plate 110B on a first side, and a heat transfer plate 150 on a second, opposite side through any appropriate connection, creating a fluid-tight seal between the components of the jet impingement assembly 101. Example connections include, but are not limited to, gaskets and mechanical fasteners, soldering, brazing, ultrasonic welding, and the like.

As stated above, the jet impingement assembly 101 may also include one or more gaskets (not shown) positioned between a manifold plate 110 and a heat transfer plate 150. The one or more gaskets can also be positioned between two manifold plates 110, such as, for example, between the distribution surface 120 of the first manifold plate 110A and the distribution surface 120 of the second manifold plate 110B. The one or more gaskets may provide a fluid-tight seal between adjacent components of the jet impingement assembly 101 such that fluid introduced to the jet impingement assembly 101 may be maintained in a closed-loop cooling system as the fluid circulates through the jet impingement assembly 101. The gaskets may be made from a variety of materials that provide a fluid-tight seal between the generally non-compliant bodies of the jet impingement assembly 101. Examples of such materials include, without limitation, natural or synthetic elastomers, compliant polymers such as silicone, and the like. The one or more gaskets may also be made from an assembly that includes compliant materials and non-compliant materials, such that the one or more gaskets provide desired sealing characteristics while maintaining their geometric configuration. In other embodiments, gaskets are not utilized, such as embodiments where soldering or brazing is used to couple the manifold and heat transfer plates.

Figure 3:
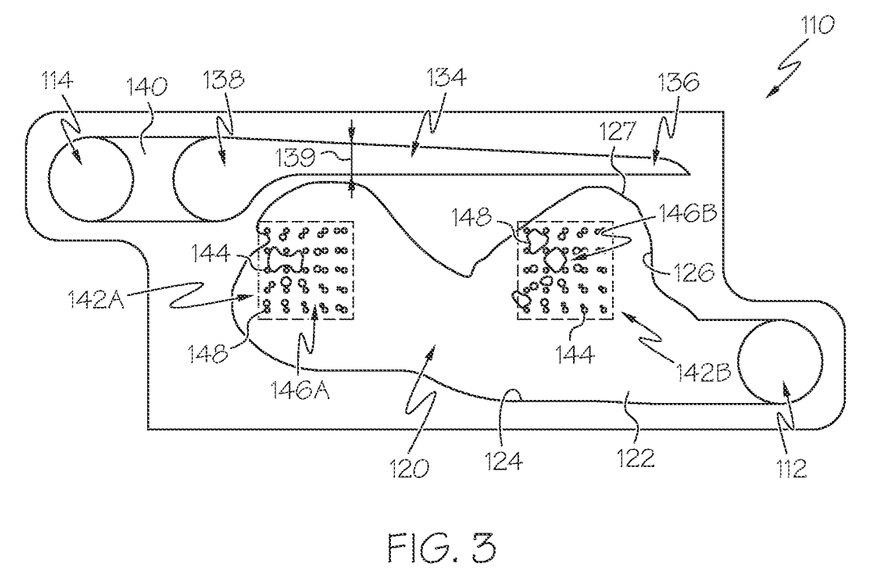
FIG. 3 schematically depicts a side view of a distribution surface of an example manifold plate according to one or more embodiments shown or described herein.
Figure 5:
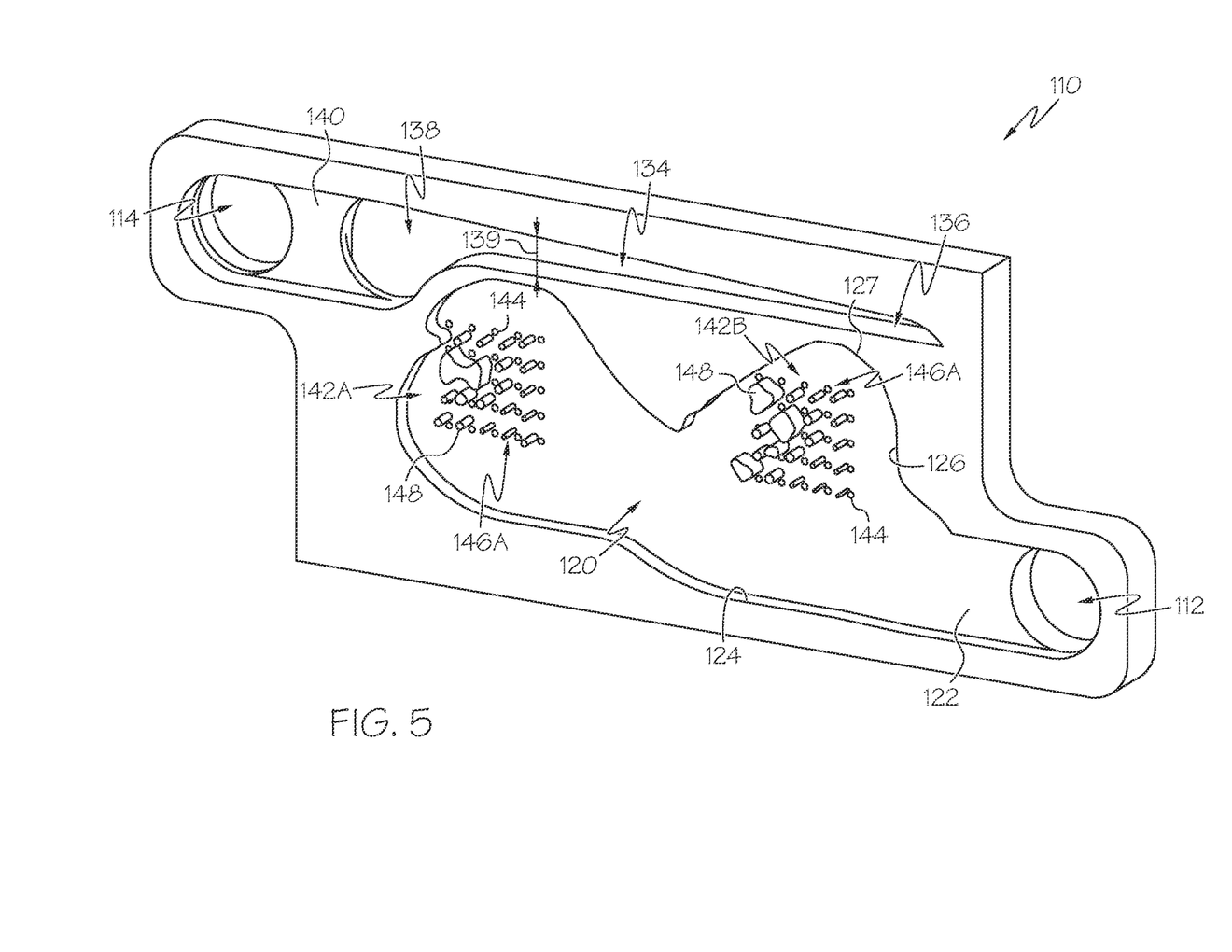
FIG. 5 schematically depicts an isometric view of the distribution surface of the manifold plate shown in FIG. 3 according to one or more embodiments shown or described herein.

Referring now to FIGS. 3 and 5, a distribution surface 120 of the manifold plate 110 shown in FIG. 2 is depicted. The distribution surface 120 comprises a fluid distribution channel 122 in fluid communication with the fluid inlet 112 of the manifold plate 110. The fluid distribution channel 122 facilitates fluid flow from the fluid inlet 112 to one or more arrays of orifices 142 positioned on the distribution surface 120 and extending through the manifold plate 110. The array of orifices 142 provide an array of impingement jets of coolant fluid toward the heat transfer plate 150.

The fluid distribution channel 122 extends into the distribution surface 120 of the manifold plate 110 and includes one or more walls 124 defining the perimeter of the fluid distribution channel 122. The wall(s) 124 of the fluid distribution channel 122 further define contours 126 to form the shape of the fluid distribution channel 122. The contours 126 are configured to provide uniform fluid velocity of a coolant fluid flowing through the fluid distribution channel 122, particularly through the array of orifices 142. The contours 126 may comprise a plurality of lobes 127 each defining an individual feature of the fluid distribution channel 122, for example a circular, elliptical, oval shaped, or other similar curved feature, which in combination, form a serpentine contour 126. The lobes 127 at least partially surround the first array of orifices 142A and the second array of orifices 142B.

While one configuration of the fluid distribution channel 122 is depicted in FIGS. 3 and 5, it should be understood that the fluid distribution channel 122 may take a variety of configurations including having a variety of slopes, lengths, discontinuous portions, non-linear portions, and the like without departing from the scope of the present disclosure. Further, as described in more detail below with respect to FIG. 9, when a first manifold plate 110A is coupled to a second manifold plate 110B, for example, as depicted in the power electronics module 100 of FIG. 1, the fluid distribution channels 122 of each manifold plate 110 are positioned proximate to one another, thereby forming a distribution manifold 128 that receives coolant fluid from the fluid inlet 112.

Still referring to FIGS. 3 and 5, as stated above, the distribution surface 120 of the manifold plate 110 further comprises two arrays of orifices 142A and 142B that extend through the manifold plate 110. It should be understood that any number of arrays of orifices 142 can be used. The two arrays of orifices 142A and 142B are positioned within the fluid distribution channel 122 of the distribution surface 120 and are in fluid communication with the fluid distribution channel 122. By extending through the manifold plate 110, the two arrays of orifices 142A and 142B fluidly couple the distribution surface 120 and the fluid distribution channel 122 with the collection surface 130 of the manifold plate 110. In the illustrated embodiment, the two arrays of orifices 142A and 142B comprise individual orifices 144 having a uniform shape and cross-sectional area. In other embodiments, the individual orifices 144 can comprise non-uniform shapes and cross sectional areas. While orifices 144 having generally cylindrical shapes and circular cross sections through the manifold plate 110 are depicted, it should be understood that the geometry of the orifices 144 may take a variety of sizes and shapes to provide jets of coolant fluid to impinge the heat transfer plate 150 and transfer heat from the heat transfer plate 150 to the coolant fluid. Similarly, the pattern of the orifices 144 extending through the manifold plate 110 may vary based on the cooling requirements of a particular application. In some embodiments, only a single orifice 144 is provided rather than an array of orifices 142.

The distribution surface 120 of the illustrated manifold plate 110 further comprises two arrays of fluid distribution features 146A and 146B that extend from a surface of the fluid distribution channel 122. Each array of fluid distribution features 146 is aligned with an array of orifices 142 to facilitate and provide uniform fluid velocity of coolant fluid flowing through the array of orifices 142. Each array of fluid distribution features 146 can be aligned with an array of orifices 142 such that individual fluid distribution features 148 are offset from individual orifices 144. The individual fluid distribution features 148 of the one or more arrays of fluid distribution features 146 comprise non-uniform shapes and cross-sectional areas. The shape of each individual fluid distribution feature 148 is configured to provide uniform fluid velocity through each individual orifice 144.

The individual fluid distribution features 148 may further comprise non-uniform heights. The shape and placement of the individual fluid distribution features 148 may be computationally determined by an optimization process, for example, some fluid distribution features 148 may comprise a height substantially equal to the depth of the fluid distribution channel 122 and other fluid distribution features 148 may comprise a height substantially less than the depth of the fluid distribution channel 122. As described in more detail below, when a first manifold plate 110A is coupled to a second manifold plate 110B, for example, as depicted in the power electronics module 100 of FIG. 1, the one or more arrays of fluid distribution features 146 are substantially equivalent such that each individual fluid distribution feature 148 of the first manifold plate 110A is positioned proximate to a matching individual fluid distribution feature 148 of the second manifold plate 110B. In some embodiments, the one or more arrays of fluid distribution features 146 of the first manifold plate 110A are not uniform with the arrays of fluid distribution features 146 of the second manifold plate 110B.

Still referring to FIGS. 3 and 5, the distribution surface 120 of the manifold plate 110 further comprises a variable slotted channel 134 providing fluid communication between the collection surface 130 (not shown in FIGS. 3 and 5) of the manifold plate 110 and the fluid outlet 114 at the distribution surface 120. As described in more detail below, the variable slotted channel 134 provides an outlet path for vapor exiting the fluid collection channel 132 in the collection surface 130 to be directed to the fluid outlet 114. The height 139 of the variable slotted channel 134 is tapered such that it increases from an inlet side 136 of the variable slotted channel 134 to an outlet side 138 of the variable slotted channel 134. By increasing the height 139 of the variable slotted channel 134, coolant fluid in the form of liquid and/or vapor can be directed from the inlet side 136 to the outlet side 138 of the variable slotted channel 134. The tapered height 139 of the variable slotted channel 134 may guide vapor toward the fluid outlet 114. The distribution surface 120 further comprises an outlet channel 140 fluidly coupling the outlet side 138 of the variable slotted channel 134 with the fluid outlet 114. The outlet channel 140 extends into, but not through the distribution surface 120, creating a fluid pathway between the variable slotted channel 134 and the fluid outlet 114. In some embodiments, the height of the outlet channel 140 is substantially equal to the diameter of the fluid outlet 114.

Figure 4:
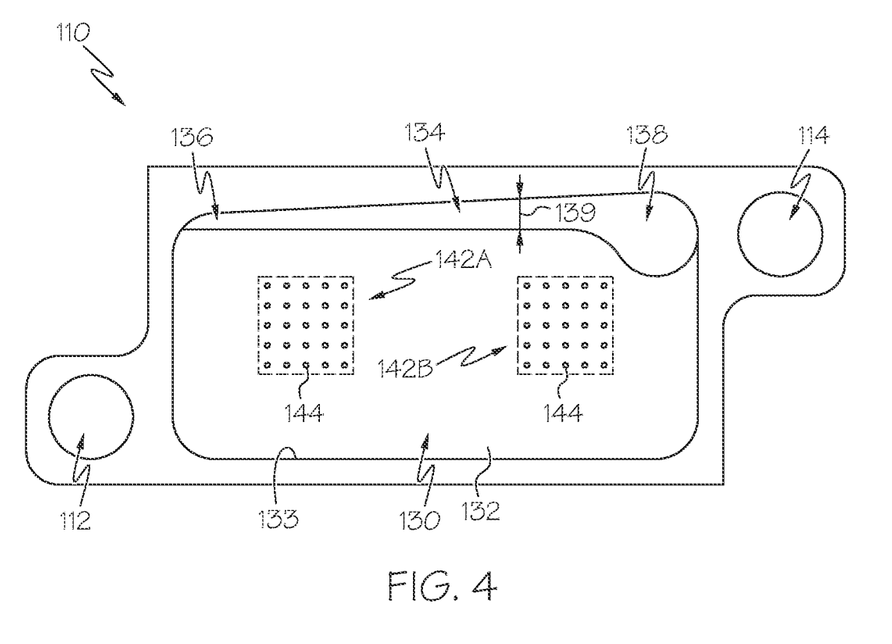
FIG. 4 schematically depicts a side view of a collection surface of the manifold plate shown in FIG. 3 according to one or more embodiments shown or described herein.
Figure 6:
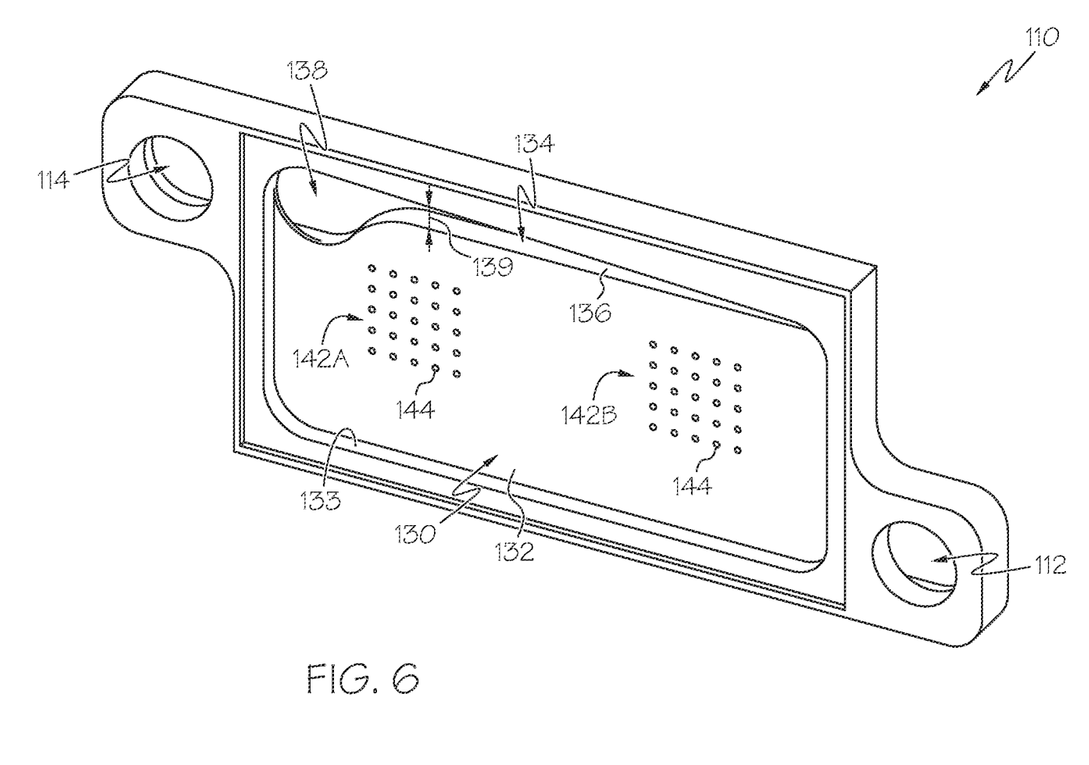
FIG. 6 schematically depicts an isometric view of the collection surface of the manifold plate shown in FIG. 4 according to one or more embodiments shown or described herein.

Referring now to FIGS. 4 and 6, a collection surface 130 of the manifold plate 110, as shown in FIG. 2, is depicted. The collection surface 130 comprises a fluid collection channel 132 in fluid communication with the arrays of orifices 142 and the variable slotted channel 134. The fluid collection channel 132 collects coolant fluid that flows through the arrays of orifices 142 as impingement jets and provides a fluid pathway from the arrays of orifices 142 to the variable slotted channel 134. The fluid collection channel 132 includes one or more walls 133 extending into the collection surface 130 of the manifold plate 110 defining the perimeter of the fluid collection channel 132. As described in more detail below with respect to FIG. 9, when a collection surface 130 of a first manifold plate 110A is coupled to a second heat transfer plate 150A, for example, as depicted in the power electronics module 100 of FIG. 1, the fluid collection channel 132 of the first manifold plate 110A is positioned proximate an impingement surface 156 of a first heat transfer plate 150B, fluidly sealing together and forming an impingement chamber 151.

Figure 7:
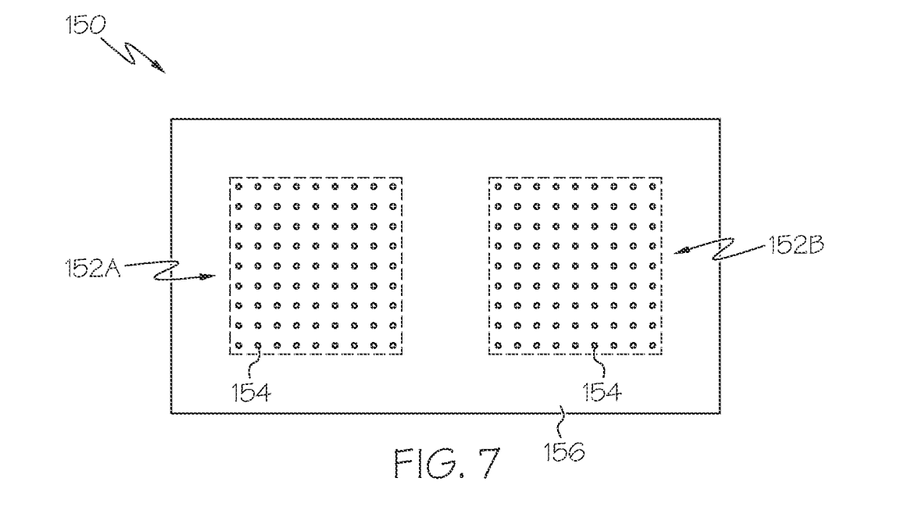
FIG. 7 schematically depicts a side view of an impingement surface of an example heat transfer plate according to one or more embodiments shown or described herein.

Referring now to FIG. 7, an impingement surface 156 of a heat transfer plate 150 is depicted. The impingement surface 156 of the illustrated embodiment comprises two arrays of fins 152A and 152B, extending from the impingement surface 156. It should be understood that the number of arrays of fins 152 may depend on the number of arrays of orifices 142. In the depicted embodiment, the position of an array of fins 152 can correspond to the location of an array of orifices 142 of a manifold plate 110 such that coolant fluid directed through the array of orifices 142 can impinge the array of fins 152. The impingement surface 156 can be coupled to the collection surface 130 of a manifold plate 110, forming an impingement chamber 151 and providing fluid communication between the arrays of orifices 142 and the variable slotted channel 134 of the manifold plate 110. As described in more detail below, the one or more arrays of fins 152 can correspond to the locations of the one or more heat generating devices 170 positioned proximate the heat transfer plate 150 (see FIG. 1).

The one or more arrays of fins 152 increase the local surface area of the heat transfer plate 150, such that coolant fluid delivered to the heat transfer plate 150 may efficiently convect heat away from the heat transfer plate 150. By increasing the surface area of the heat transfer plate 150, the heat transfer rate from the heat transfer plate 150 to the coolant fluid may be enhanced. Each individual fin 154 targets the heat transfer rate from the heat transfer plate 150 to maximize cooling of the heat generating devices 170. In some embodiments, the heat transfer plate 150, including the fins 154, may have a variety of configurations including being made from uniform, isotropic materials, non-isotropic materials, composite materials, or the like. In some embodiments, the fins 154 of the heat transfer plate 150 may include a coating, for example a porous coating, that increases the surface area of the fins 154, thereby increasing heat transfer away from the heat transfer plate 150. In some embodiments, the fins 154 may be constructed from a porous material. Additionally, it should be understood that in some embodiments, the heat transfer plates 150 may not be provided with fins 154.

Figure 8:
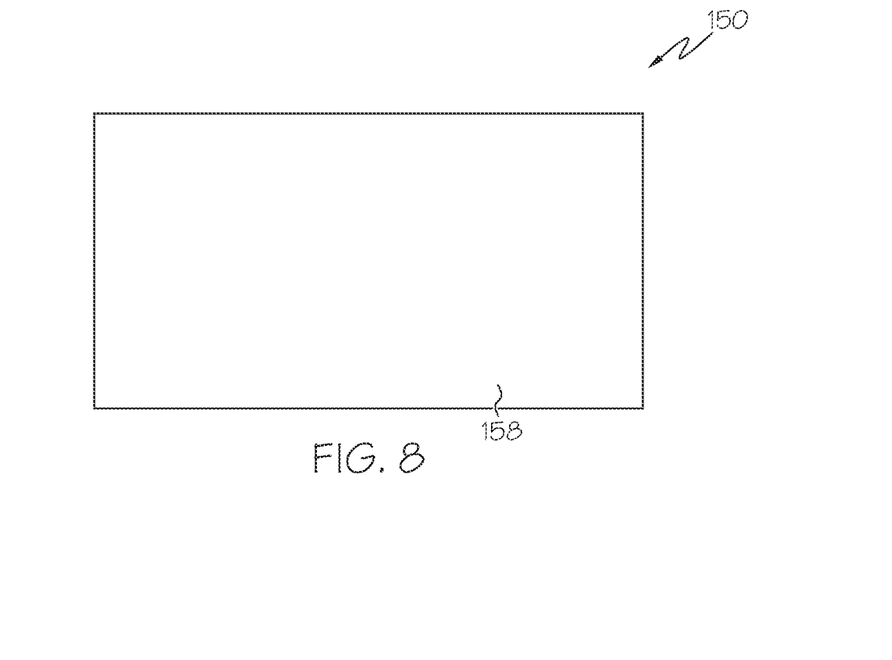
FIG. 8 schematically depicts a side view of a heat transfer surface of the heat transfer plate shown in FIG. 7 according to one or more embodiments shown or described herein.

Referring now to FIG. 8, a heat transfer surface 158 of a heat transfer plate 150 is depicted. As stated above, the heat transfer surface 158 is thermally coupled to one or more heat generating devices 170 at locations on the heat transfer plate 150 corresponding with the array of fins 154 of the impingement surface 156. The heat transfer surface 158 operates to transfer heat from a heat generating device 170 to the heat transfer plate 150, including the one or more arrays of fins 152. Heat transferred to the heat transfer plate 150 by the one or more heat generating devices 170 can be transferred to coolant fluid flowing through the jet impingement assembly 101. In some embodiments, the coolant fluid flows into the jet impingement assembly 101 in liquid form. When heat is transferred from the heat generating device 170, through the heat transfer plate 150 to the coolant fluid, the coolant fluid undergoes a phase transformation into gaseous form. As described in more detail below, the jet impingement assembly 101 is configured to support this two-phase cooling operation.

Figure 9:
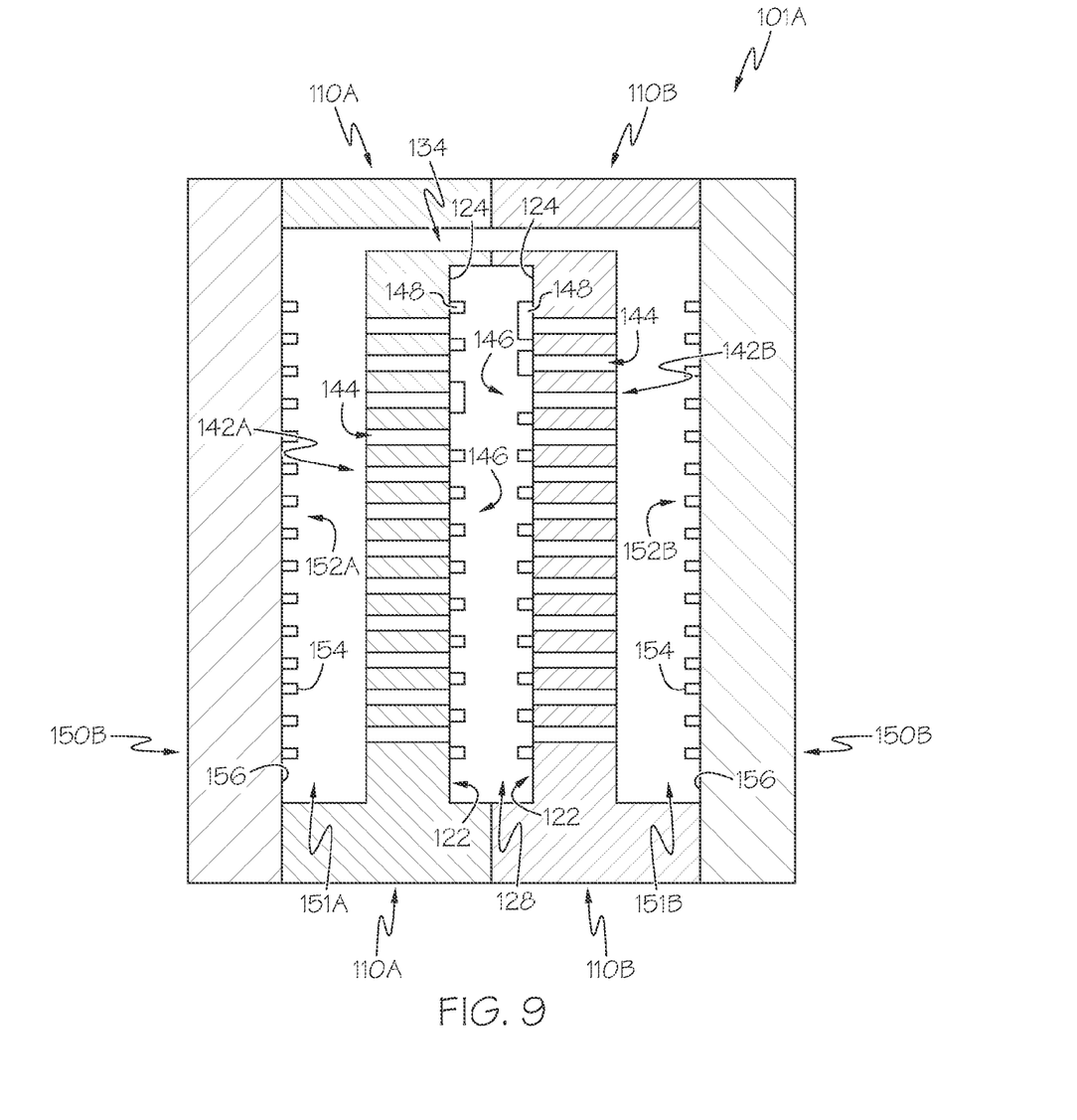
FIG. 9 schematically depicts a cross sectional view of an individual jet impingement assembly of the power electronics module of FIG. 1 taken along line A according to one or more embodiments shown or described herein.

Referring now to FIG. 9, a side cross-sectional view of the jet impingement assembly 101A of the power electronics module 100 of FIG. 1 is depicted. The first manifold plate 110A is coupled to the second manifold plate 110B, forming a distribution manifold 128 between the first manifold plate 110A and the second manifold plate 110B. The distribution manifold 128 is defined by the fluid distribution channel 122 of the first manifold plate 110A and the fluid distribution channel 122 of the second manifold plate 110B. The walls 124 of each fluid distribution channel 122 define the perimeter of the distribution manifold 128. The distribution manifold 128 provides a sealed fluid chamber that fluidly couples the fluid inlet 112 with the array of orifices 142.

Referring still to FIG. 9, the first heat transfer plate 150A is coupled to the first manifold plate 110A, forming impingement chamber 151A between the heat transfer plate 150A and the first manifold plate 110A. The second heat transfer plate 150B is coupled to the second manifold plate 110B, forming impingement chamber 151B between the second heat transfer plate 150B and the second manifold plate 110B. The arrays of orifices 142A and 142B extend through each manifold plate 110A and 110B, thereby fluidly coupling the distribution manifold 128 with the impingement chambers 151A and 151B of the first heat transfer plate 150A and the second heat transfer plate 150B. Each impingement chamber 151A and 151B is defined by the fluid collection channel 132 of a heat transfer plate 150 and the collection surface 130 of a manifold plate 110. The impingement chamber 151A and 151B provides a volume for jets of coolant fluid to impinge the arrays of fins 152A and 152B positioned on the impingement surface 156. It should be understood that some components of the jet impingement assembly 101A are not expressly numbered in FIG. 9 for ease of illustration.

Referring once again to FIG. 1, operation of the power electronics module 100 will now be described. Coolant fluid flows through the inlet pipe 106 such that a portion of coolant fluid enters each jet impingement assembly 101A-101F in the power electronics module 100. The volume of the portion of coolant fluid that enters each jet impingement assembly 101 is substantially equal such that there is uniform fluid velocity and uniform fluid volume through each jet impingement assembly 101A-101F. The inlet pipe 106 and the outlet pipe 108 may be coupled to a fluid reservoir (not shown) that houses coolant fluid. The fluid reservoir can provide coolant fluid to the power electronics module 100 through the inlet pipe 106 and cool heated coolant fluid when it returns to the fluid reservoir through the outlet pipe 108, preparing the coolant fluid for reuse. Generally, the coolant fluid flows through the fluid inlet 112, enters the distribution manifold 128 formed by the manifold plates 110A and 110B, impinges the heat transfer plates 150A and 150B, and exits through the fluid outlet 114 into the outlet pipe 108.

More specifically, referring once again to FIG. 2, coolant fluid enters the jet impingement assembly 101 through the fluid inlet 112 and travels into the distribution manifold 128 formed by the fluid distribution channel 122 of the first manifold plate 110A and the fluid distribution channel 122 of the second manifold plate 110B. Coolant fluid introduced to the distribution manifold 128 flows in a downstream direction from the fluid inlet 112, through the fluid distribution channel 122 toward the arrays of orifices 142. It should be understood that the coolant fluid flowing from the fluid inlet 112 to the one or more arrays of orifices 142 may not follow the shortest path length. Accordingly, as used herein, "downstream" refers to the direction and relative orientation of the flow of the coolant fluid away from the fluid inlet 112.

The geometric configuration of the contours 126 of the fluid distribution channel 122 may alter the cross-sectional flow area of the fluid distribution channel 122 such that the coolant fluid flows downstream at a uniform fluid velocity throughout the fluid distribution channel 122 and into each orifice 144. Further, the size and shape of each fluid distribution feature 148 is configured to alter the velocity of coolant fluid to provide uniform velocity of coolant fluid into and through each orifice 144. When coolant fluid passes through an orifice 144, it forms a jet of coolant fluid directed at the array of fins 152 positioned on the impingement surface 156 of the heat transfer plate 150. As the coolant fluid approaches the array of orifices 142, coolant fluid positioned proximate to an individual orifice 144 will flow through the individual orifice 144, forming a jet of coolant fluid that is ejected through the manifold plate 110 toward the heat transfer plate 150. Coolant fluid that remains in the fluid distribution channel 122 continues to flow in the downstream direction until the coolant fluid is directed through one of the individual orifices 144 and toward the heat transfer plate 150. The jet of coolant fluid impinges the array of fins 152 and transfers heat from the array of fins 152 to the coolant fluid. This heat transfer causes some or all of the coolant fluid to undergo a phase change from liquid to vapor that collects in the impingement chamber 151.

After impinging the one or more arrays of fins 152 of the heat transfer plate 150, the coolant fluid flows away from the one or more arrays of fins 152 within the impingement chamber 151 and flows along the fluid collection channel 132. As stated above, some or all of the coolant fluid changes phases from a liquid to a vapor due to the high temperature of the heat transfer plate 150 caused by the heat generating device 170 (e.g., an electronics device). This phase change causes vapor to form in the impingement chamber 151. Vapor coolant fluid, having a lower density than liquid coolant fluid entering the impingement chamber 151, rises along the fluid collection channel 132 into the variable slotted channel 134 positioned substantially vertical from the fluid collection channel 132.

Vapor coolant fluid enters the variable slotted channel 134 which is fluidly coupled to the fluid collection channel 132. The tapered configuration of the variable slotted channel 134, such that the height 139 of the variable slotted channel 134 increases from an inlet side 136 to an outlet side 138, directs vapor coolant fluid toward the outlet side 138 of the variable slotted channel 134 because the increasing cross sectional area of the variable slotted channel 134 provides a pathway for the higher pressure vapor coolant fluid. The outlet channel 140 is downstream from the variable slotted channel 134 and fluidly couples the outlet side 138 of the variable slotted channel 134 with the fluid outlet 114 of the manifold plate 110. Coolant fluid passes from the variable slotted channel 134 into the outlet channel 140 where it transfers back to the distribution surface 120 of the manifold plate 110 and then exits the manifold plate 110 through the fluid outlet 114. The coolant fluid then flows into the outlet pipe 108 and travels to the fluid reservoir where the coolant fluid is prepared for reuse.

It should now be understood that jet impingement assemblies and power electronics modules incorporating jet impingement assemblies allow for efficient transfer of heat away from heat generating devices, which may increase the life of the heat generating device. The jet impingement assemblies include a first manifold plate coupled to a second manifold plate, each having a fluid inlet, a distribution surface, a collection surface, and a fluid outlet. The distribution surface defines a distribution manifold having a fluid distribution channel and one or more arrays of orifices extending through each manifold plate. The fluid distribution channel is contoured to provide uniform fluid velocity through the fluid distribution channel and the array of orifices. Heat transfer plates are coupled to each collection surface forming impingement chambers between the impingement surface of the heat transfer plate and the fluid collection channel of the manifold plate. The heat transfer plates include one or more an arrays of fins extending toward the collection surface of each manifold plate, which is fluidly coupled to the fluid outlet. Coolant fluid can flow through the array of orifices, impinging the array of fins and allowing heat to transfer from the heat transfer plate to the coolant fluid.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A jet impingement assembly comprising:
   a first manifold plate coupled to a second manifold plate, wherein the first manifold plate and the second manifold plate each comprise:
   a fluid inlet;
   a fluid outlet;
   a distribution surface comprising a fluid distribution channel in fluid communication with the fluid inlet;
   a collection surface comprising a fluid collection channel in fluid communication with the fluid outlet, wherein the distribution surface of the first manifold plate is coupled to the distribution surface of the second manifold plate such that the fluid distribution channel of the first manifold plate and the fluid distribution channel of the second manifold plate define a distribution manifold;
   a variable slotted channel fluidly coupled to the fluid outlet at the distribution surface; and
   an array of orifices extending from the distribution surface to the collection surface;
   a first heat transfer plate coupled to the collection surface of the first manifold plate such that the first heat transfer plate and the collection surface of the first manifold plate form a first impingement chamber, the first heat transfer plate comprising an array of fins that extends toward the collection surface of the first manifold plate; and
   a second heat transfer plate coupled to the collection surface of the second manifold plate such that the second heat transfer plate and the collection surface of the second manifold plate form a second impingement chamber, the second heat transfer plate comprising an array of fins that extends toward the collection surface of the second manifold plate;
   wherein the first manifold plate, the second manifold plate, the first heat transfer plate, and the second heat transfer plate are positioned in a horizontal stack such that the fluid inlet of the first manifold plate is adjacent to the fluid inlet of the second manifold plate.

2. The jet impingement assembly of claim 1 wherein the variable slotted channel is fluidly coupled to an outlet channel positioned on the distribution surface of the manifold plate such that the variable slotted channel provides fluid communication between the fluid collection channel and the fluid outlet.

3. The jet impingement assembly of claim 1 wherein a height of the variable slotted channel increases from an inlet side of the variable slotted channel to an outlet side of the variable slotted channel.

4. The jet impingement assembly of claim 1 wherein the fluid inlet is positioned diagonally from the fluid outlet.

5. The jet impingement assembly of claim 1 wherein one or more walls of the fluid distribution channel further comprise a contour configured to provide uniform fluid velocity of a coolant fluid flowing through the fluid distribution channel.

6. The jet impingement assembly of claim 1 wherein an array of fluid distribution features is aligned with the array of orifices to provide uniform fluid velocity of a coolant fluid flowing through the array of orifices.

7. The jet impingement assembly of claim 1 wherein multiple arrays of orifices are positioned on each manifold plate and multiple arrays of fins are positioned on each heat transfer plate such that each individual array of orifices is positioned proximate an individual array of fins.

8. A power electronics module comprising:
a jet impingement assembly comprising:
a first manifold plate coupled to a second manifold plate, wherein the first manifold plate and the second manifold plate each comprise:
a fluid inlet;
a fluid outlet;
a distribution surface comprising a fluid distribution channel in fluid communication with the fluid inlet;
a collection surface comprising a fluid collection channel in fluid communication with the fluid outlet, wherein the distribution surface of the first manifold plate is coupled to the distribution surface of the second manifold plate such that the fluid distribution channel of the first manifold plate and the fluid distribution channel of the second manifold plate define a distribution manifold;
a variable slotted channel fluidly coupled to the fluid outlet at the distribution surface; and
an array of orifices extending from the distribution surface to the collection surface;
a first heat transfer plate coupled to the collection surface of the first manifold plate such that the first heat transfer plate and the collection surface of the first manifold plate form a first impingement chamber, the first heat transfer plate comprising an array of fins that extends toward the collection surface of the first manifold plate; and
a second heat transfer plate coupled to the collection surface of the second manifold plate such that the second heat transfer plate and the collection surface of the second manifold plate form a second impingement chamber, the second heat transfer plate comprising an array of fins that extends toward the collection surface of the second manifold plate;
wherein the first manifold plate, the second manifold plate, the first heat transfer plate, and the second heat transfer plate are positioned in a horizontal stack such that the fluid inlet of the first manifold plate is adjacent to the fluid inlet of the second manifold plate;
a first electronics device positioned in contact with the first heat transfer plate opposite the array of fins; and
a second electronics device positioned in contact with the second heat transfer plate opposite the array of fins.

9. The power electronics module of claim 8 wherein the variable slotted channel is fluidly coupled to an outlet channel positioned on the distribution surface of the manifold plate such that the variable slotted channel provides fluid communication between the fluid collection channel and the fluid outlet.

10. The power electronics module of claim 8 wherein a height of the variable slotted channel increases from an inlet side of the variable slotted channel to an outlet side of the variable slotted channel.

11. The power electronics module of claim 8 wherein the fluid inlet is positioned diagonally from the fluid outlet.

12. The power electronics module of claim 8 wherein one or more walls of the fluid distribution channel further comprise a contour configured to provide uniform fluid velocity of a coolant fluid flowing through the fluid distribution channel.

13. The power electronics module of claim 8 wherein an inlet pipe extends between the fluid inlet of the first manifold plate and the fluid inlet of the second manifold plate and an outlet pipe extends between the fluid outlet of the first manifold plate and the fluid outlet of the second manifold plate.

14. The power electronics module of claim 8 wherein the first electronics device and the second electronics device each comprise a semiconductor device.

15. A power electronics module comprising:
a plurality of jet impingement assemblies, each jet impingement assembly comprising:
a first manifold plate coupled to a second manifold plate, wherein the first manifold plate and the second manifold plate each comprise:
a fluid inlet;
a fluid outlet;
a distribution surface comprising a fluid distribution channel in fluid communication with the fluid inlet;
a collection surface comprising a fluid collection channel in fluid communication with the fluid outlet, wherein the distribution surface of the first manifold plate is coupled to the distribution surface of the second manifold plate such that the fluid distribution channel of the first manifold plate and the fluid distribution channel of the second manifold plate define a distribution manifold;
a variable slotted channel fluidly coupled to the fluid outlet at the distribution surface; and
an array of orifices extending from the distribution surface to the collection surface;
a first heat transfer plate coupled to the collection surface of the first manifold plate such that the first heat transfer plate and the collection surface of the first manifold plate form a first impingement chamber, the first heat transfer plate comprising an array of fins that extends toward the collection surface of the first manifold plate; and
a second heat transfer plate coupled to the collection surface of the second manifold plate such that the second heat transfer plate and the collection surface of the second manifold plate form a second impingement chamber, the second heat transfer plate comprising an array of fins that extends toward the collection surface of the second manifold plate;
wherein the first manifold plate, the second manifold plate, the first heat transfer plate, and the second heat transfer plate are positioned in a horizontal stack such that the fluid inlet of the first manifold plate is adjacent to the fluid inlet of the second manifold plate, wherein the plurality of jet impingement assemblies are interleaved such that each jet impingement assembly is adjacent to at least one other jet impingement assembly, the fluid inlets of adjacent jet impingement assemblies are aligned, and the fluid outlets of adjacent jet impingement assemblies are aligned; and at least one electronics device is positioned between adjacent jet impingement assemblies.

16. The power electronics module of claim 15 wherein the variable slotted channel is fluidly coupled to an outlet channel positioned on the distribution surface of the manifold plate such that the variable slotted channel provides fluid communication between the fluid collection channel and the fluid outlet.

17. The power electronics module of claim 15 wherein a height of the variable slotted channel increases from an inlet side of the variable slotted channel to an outlet side of the variable slotted channel.

18. The power electronics module of claim 15 wherein the fluid inlet is positioned diagonally from the fluid outlet.

19. The power electronics module of claim 15 wherein an inlet pipe extends between at least two fluid inlets and an outlet pipe extends between at least two fluid outlets.

20. The power electronics module of claim 15 wherein the at least one electronics device comprises a semiconductor device.

* * * * *